United States Patent [19]

King et al.

[11] Patent Number: 5,159,617
[45] Date of Patent: Oct. 27, 1992

[54] EXPLOSIVE DETECTION METHOD AND APPARATUS USING SELECTIVE GAMMA RAY RESONANCE ABSORPTION

[75] Inventors: J. Derwin King; Colin Nicholls, both of San Antonio, Tex.

[73] Assignee: Southwest Research Institute

[21] Appl. No.: 791,873

[22] Filed: Nov. 13, 1991

[51] Int. Cl.⁵ .................... G01N 23/06; G01N 33/22
[52] U.S. Cl. ................ 378/57; 250/390.04; 376/159; 324/307
[58] Field of Search .............. 250/358.1, 390.04; 378/57, 53; 324/320, 321, 322, 307; 376/159, 159, 161, 165, 166

[56] References Cited

U.S. PATENT DOCUMENTS

| | | | |
|---|---|---|---|
| 3,124,679 | 3/1964 | Tittman et al. | 250/390 C |
| 3,832,545 | 8/1974 | Bartko | 250/359.1 |
| 3,997,787 | 12/1976 | Fearon et al. | 250/390.04 X |
| 4,166,972 | 9/1979 | King et al. | 324/310 |
| 4,296,378 | 10/1981 | King | 324/313 |
| 4,357,535 | 11/1982 | Haas | 378/57 |
| 4,442,354 | 4/1984 | Hurst et al. | 250/281 |
| 4,514,691 | 4/1985 | De Los Santos et al. | 324/301 |
| 4,851,687 | 7/1989 | Ettinger et al. | 250/390.04 |
| 4,877,034 | 12/1989 | Smith | 324/307 |
| 5,080,856 | 1/1992 | Grenier et al. | 376/159 |
| 5,098,640 | 3/1992 | Gozani et al. | 376/166 |

Primary Examiner—Carolyn E. Fields
Assistant Examiner—Drew A. Dunn
Attorney, Agent, or Firm—Gunn, Lee & Miller

[57] ABSTRACT

An apparatus and method for determining the presence of certain elements or compounds within an object, wherein the object under examination contains both nuclei of a first type which exhibit nuclear magnetic resonance and nuclei of a second type which exhibit nuclear quadrupolar resonance. The apparatus and method involve subjecting the object to a magnetic field and to a radiation beam whose characteristics in the presence of a magnetic field and in the absence of a magnetic field can be measured. The radiation transmission and/or absorption "fingerprint" of a particular substance is experimentally determined and recorded in the presence of a magnetic field calculated to optimize a cross coupling between nuclei of the first (NMR) type and nuclei of the second (NQR) type. This reference is then utilized later as a basis on which to identify an unknown compound exhibiting the same radiation absorption and/or transmission characteristics in response to the same or similar magnetic field intensity. Specific types of radiation and specific magnetic field intensities are pre-selected as optimizing the detectability of specific NMR/NQR element pairs.

9 Claims, 5 Drawing Sheets

EXPLOSIVE DETECTION METHOD AND APPARATUS USING SELECTIVE GAMMA RAY RESONANCE ABSORPTION

BACKGROUND OF THE INVENTION

1. Field of the Invention

The present invention is directed to an apparatus and method for determining the presence of specific elements or compounds within an object. The present invention is more specifically directed to an apparatus and method that utilizes a measurable change in the radiation absorption and/or transmission characteristics of an object due to resonant frequency coupling between nuclei of certain elements within the object to identify the presence of the specific elements or compounds within the object.

2. Description of the Prior Art

One of the most important applications of methods and devices designed to non-intrusively detect the presence of specific elements and compounds is the provision of improved security for passengers in domestic and international travel. There is a significant need in both the governmental and private sector for a rapid and reliable technique for the detection of explosive devices within luggage or parcels carried onto air craft or brought into buildings. The demand for a fast and effective device for scanning such objects to determine the presence of explosives has only increased in recent years.

Explosive devices hidden in packages, letters, luggage, and elsewhere are easy to detect with metal detectors if they incorporate substantial quantities of metal. There are many different techniques that will locate such metallic explosives by detecting the presence and quantity of a number of types of metals. However, it is becoming increasingly more likely that such hidden explosives will be made from non-metallic materials. It is well known that many of these non-metallic explosives may be detected by sensing the amount of nitrogen present in the object being analyzed.

One technique of detecting the presence of nitrogen involves subjecting the object under consideration to a thermal neutron flux environment. Neutron capture can be measured by a resulting emission of gamma rays from the nuclei of the nitrogen atoms if they are present. The gamma ray spectrum that results from such neutron capture can, to some extent, be associated with certain characteristics of particular nitrogen containing compounds.

U.S. Pat. No. 3,124,679, issued to Tittman, et al utilizes the neutron capture effect to determine the presence of nitrogen in objects. The material being examined is irradiated with neutrons, and the resultant gamma rays are measured at appropriate angles from the impinging radiation. Certain gamma rays that have energy characteristics typical of the elements that are desired to be detected are selected and measured. Unfortunately, the technique described in the Tittman patent examines only the total nitrogen content and is, therefore, not capable of distinguishing explosives from every day articles that contain like amounts of nitrogen such as wool, silk, leather, and certain food products.

U.S. Pat. No. 3,832,545, issued to Bartko also applies the neutron capture principle to detect the presence of nitrogen within baggage. Bartko utilizes an array of gamma ray detectors to provide a silhouette or profile of the object under examination. Unfortunately, this silhouette is without fine definition and the possibility of mistaking an innocent nitrogen containing object within the luggage for an explosive device, or vice versa, still exists. In addition, the Bartko device requires an optimal thermal flux density within the radiation chamber that is not readily achievable.

U.S. Pat. No. 4,851,687, issued to Ettinger, et al also utilizes neutron capture to determine the presence of nitrogen in objects and improves upon the Bartko patent by incorporating an array of thermal neutron sensors within the examination chamber to monitor the amount of thermal neutrons and adjust the flux within the chamber to maintain flux density at an optimum level. The object is scanned rather than merely illuminated in this manner and adjustments are continuously made so as to provide a distribution profile of the nitrogen contained within the object. This more accurate profile produced by the Ettinger design does improve upon previous efforts at applying the thermal neutron principle, but still leaves a significant possibility for errors and false alarms.

A second approach to detecting the presence of nitrogen within objects under consideration involves the application of nuclear magnetic resonance or NMR. Nuclear magnetic resonance is defined as a resonance achieved, whereby energy is transferred between a magnetic field and nuclei placed within the magnetic field, that is of a strength sufficient to at least partially decouple the nuclei from their orbital electrons. The relationship between the frequency at which maximum energy is absorbed by the atomic nuclei of the element, the resonant frequency, and the magnetic field intensity is indicative of the particular element involved.

The NMR detection technique, in general, is old and is found in a number of previously described detection systems. One of the difficulties with these various systems using NMR techniques involves the fact that significant quantities of the material must be present to concentrate the elements of interest so that a noticeable response is achieved. The signals obtained by NMR techniques are typically very small and require high resolution detection equipment.

U.S. Pat. No. 4,166,972, issued to King, et al describes a method and apparatus for enhanced nuclear magnetic resonance discrimination and detection that focuses on the response of combinations of first and second distinct atomic elements that are placed within a variable magnetic field. Variations in the magnetic field alter the NMR frequency of the first element of interest (hydrogen for example) so as to coincide with a nuclear quadrupolar resonance (NQR) of a second element of interest (nitrogen for example). Energy is transferred in an enhanced fashion between the nuclei of the first element and the nuclei of the second element, and thereby reduces the NMR response time of the first element, which improves the detectability of that element. It is the detectability provided by the '972 patent that improves over the previous applications of the NMR technique. The '972 patent nonetheless is designed only to detect characteristic NMR changes associated with elements that are still quite prevalent in non-explosive, non-suspect compounds. The possibility, therefore, for characterizing an innocent object as an explosive still exists.

U.S. Pat. No. 4,296,378, also issued to King, describes a method of application similar, in some respects, to that of the '972 patent, but does not distinguish between substances in which the desirable cross relaxation occurs, and those substances that merely contain nuclei of the first kind of element with similar NMR relaxation times.

U.S. Pat. No. 4,514,691, issued to De Los Santos, et al likewise focuses on the NMR effects upon a first elemental nuclei when subjected to a magnetic field. (Typically this first element nuclei is hydrogen). The De Los Santos patent then measures the NMR response of elemental hydrogen in compounds by sending out an interrogation pulse from a second magnet and receiving echoes back that are stored and analyzed. The NMR response of certain types of explosives which contain elemental hydrogen is compared to the signals received and used to identify the presence of such explosives. While further limiting the range of elements that might be detected by the method, the De Los Santos patent still, by focusing on the hydrogen component in NMR technology, is faced with a range of error possibilities.

U.S. Pat. No. 4,887,034, issued to Smith discloses a method and apparatus for the detection of compounds containing both NMR exhibiting nuclei and NQR exhibiting nuclei. The Smith patent describes the use of both magnetic field changes and the application of pulse sequences in RF fields in various combinations. Variations in the magnitude of the NMR signals obtained as a result are used to characterize certain explosive substances. The Smith patent still, however, focuses on making measurements of the first, NMR type, element (typically hydrogen) rather than identifying compounds associated with characteristics of the second, NQR type, element.

As described above in many of the referenced patents, explosives detection is typically based upon determining the presence of several different elements together. The elements, as can be detected, come in different ratios for different explosives and can, therefore, be identified with different signatures. Explosive compounds typically contain the elements of hydrogen, nitrogen, carbon, and oxygen. The relative amounts of each of these elements varies and, in some explosives, some of these elements may not be present. The response of elemental hydrogen to NMR techniques, as described above, is high compared to the response of nitrogen. This is why, in most cases, the hydrogen nuclei is considered the first element with varying NMR frequencies that coincides with variations in magnetic field strength, and nitrogen is the second element with a fixed NQR frequency. Unfortunately, hydrogen is typically a constituent of materials near or surrounding the object being examined. All of the above referenced inventions, therefore, that apply the use of NMR technology to the examination of an object fail to sufficiently limit the scope of the objects detected because of their focus on the hydrogen components.

In a similar manner, those techniques described above that utilize thermal neutron capture as the examining radiation only identify the presence of nitrogen rather than its presence in a particular compound or with some other element typical of an explosive. It would be advantageous, therefore, to employ an apparatus and method that focussed not on the hydrogen component of an explosive compound, but rather the nitrogen component, and would thereby narrow the field of possible identifications of the compound, and in addition employ the "fingerprinting" capabilities of the NMR and NQR techniques to further limit and distinguish the nitrogen compounds.

SUMMARY OF THE INVENTION

It is, therefore, an object of the present invention to provide an apparatus and method for detecting the presence of explosives containing nitrogen and hydrogen that discriminates compounds containing nitrogen and hydrogen that are not explosive, and which achieves this discrimination in a rapid and efficient means.

It is another object of the present invention to provide an apparatus and method that enhances conventional nuclear resonance absorption methods of detecting concealed explosives by providing a degree of chemical selectivity in the absorption profile.

It is a further object of the present invention to improve upon the discrimination capabilities of conventional thermal neutron techniques of determining the presence of nitrogen in compounds by providing a degree of chemical selectivity to the characteristic magnetic field strength at which gamma ray emission peaks.

It is a further object of the present invention to provide an apparatus and method for scanning an object for nitrogen and for detecting the presence of certain other elements in association with the nitrogen in a manner that reduces the number of possible compounds containing such combinations to a few identifiable substances.

It is a further object of the present invention to provide an apparatus and method for detecting the presence of a compound that contains NMR responsive nuclei of a first element in combination with NQR responsive nuclei of a second element whose radiation transmission and/or absorption characteristics have been previously determined by experimental measurement.

It is a further object of the present invention to employ NMR/NQR coupling effects to alter or enhance the absorption and/or transmission of radiation through an object under study in a manner that is characteristic of the compounds within that object.

It is a further object of the present invention to provide an apparatus and method for determining the presence of any compounds containing atomic nuclei with characteristic NQR effects.

In fulfillment of these and other objects, the present invention provides an apparatus and method that places an object containing elements or compounds that include a first element with characteristic NMR responses and a second element with characteristic NQR responses in the path of a beam of radiation and within a variable magnetic field. The present method and apparatus apply a magnetic field with an intensity appropriate to couple the first (NMR) atomic nuclei to the second (NQR) atomic nuclei. This coupling is known to have specific effects on the absorption and/or transmission of radiation through the object containing the elements. The characteristic absorption and/or transmission of radiation can be "fingerprinted" by experimental analysis and thereafter used to compare with the radiation absorption and/or transmission of an unknown substance.

In a preferred embodiment, the gamma ray absorption characteristics of nitrogen are used to initially screen an object for the presence of nitrogen. The object may then be subjected to a magnetic field of a predetermined intensity that is designed to couple the NMR frequency of associated hydrogen nuclei to the NQR frequency of the nitrogen present within the object. The level of the magnetic field intensity to which the object is subjected has been previously determined to create gamma ray absorption changes of a particular nature indicative of certain types of explosives. The explosive "fingerprint" associated with the ratios and concentrations of hydrogen and nitrogen within the explosive compounds are distinctive enough from each other and from innocent substances as to allow the discrimination of these innocent substances from actual explosives.

Alternative embodiments of the present invention incorporate alternative means for subjecting the nitrogen containing compounds to radiation that transmits, or stimulates the transmission of, measurable gamma rays or provides some other form of radiative response. Changes in the gamma ray emissions that result from neutron capture, for example, may also be measured as characteristic of particular hydrogen/nitrogen compounds.

In addition to the use of the present apparatus and method for detecting the existence of explosives in luggage and other objects entering air planes or buildings, the present invention has applications wherever the identification of specific substances without intrusion is required. The apparatus and method is not restricted to determining the presence of nitrogen in conjunction with hydrogen, but is appropriate for use wherever atomic nuclei exhibiting NQR behavior are found to be associated with atomic nuclei with NMR behavior. Applications in the medical field, as well as the non-destructive evaluation of materials are possible. Other objects of the present invention will become apparent to those skilled in the art from a review of the below detailed descriptions of the preferred embodiments and from the appended claims.

DETAILED DESCRIPTION OF THE PREFERRED EMBODIMENT

Figure 1:
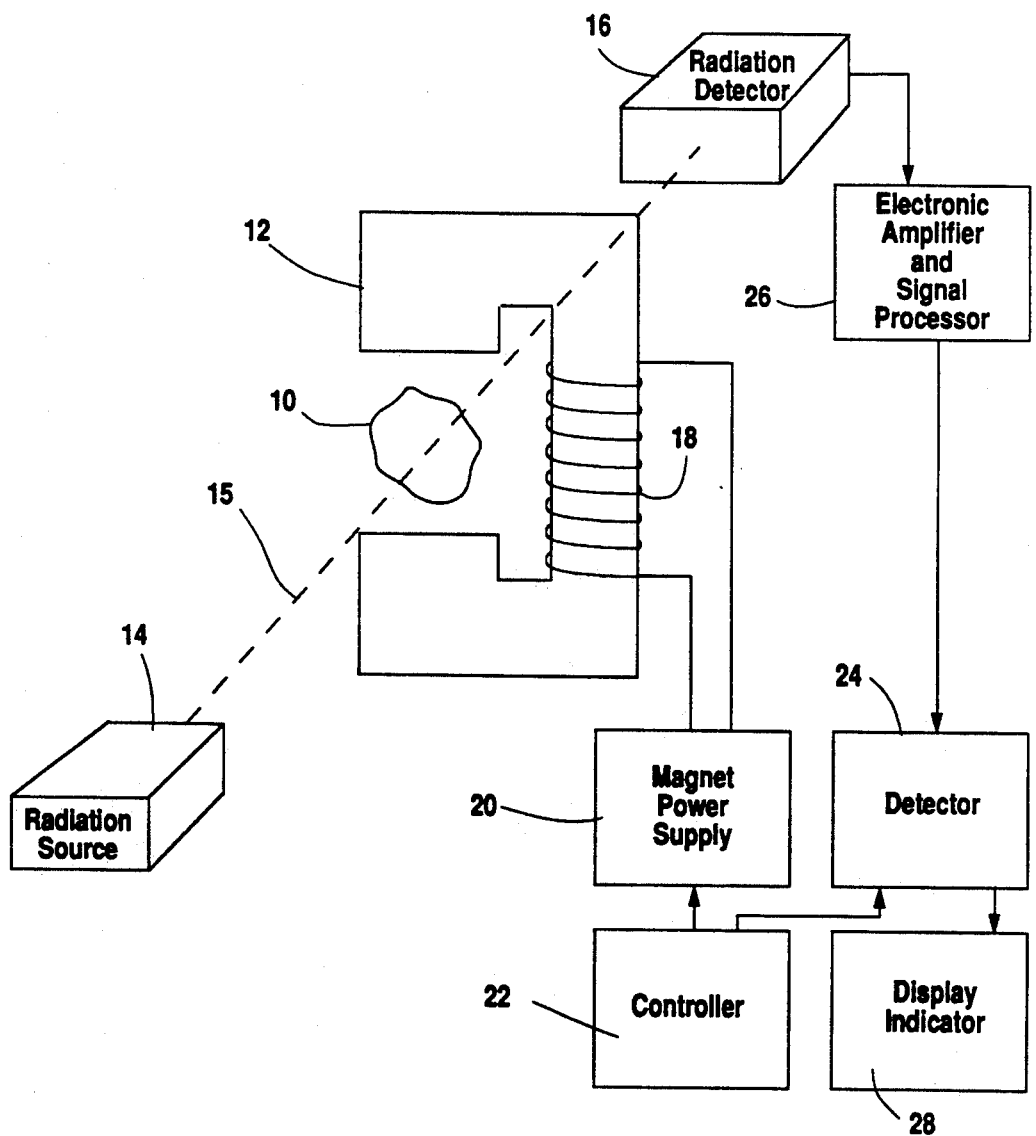
FIG. 1 is a schematic diagram of an apparatus for implementing the method of detecting the presence of a specific compound according to the present invention.

Reference is now made to FIG. 1 for a detailed description of an apparatus appropriate for implementing the method of the present invention. Unknown compound 10 to be inspected is placed within the poles of electromagnet 12. Compound 10 is simultaneously exposed to penetrating radiation from radiation source 14. Transmitted, or scattered radiation from radiation source 14, which passes through or is produced by unknown compound 10, is detected on an opposite side of compound 10 in an appropriate angular position, by radiation detector 16. The output of radiation detector 16 is processed and amplified by electronic amplifier and signal processor 26. The amplification and signal processing is achieved to enhance the specific characteristics of the radiation changes that are of interest.

Electromagnet 12 is driven by coils 18 which are provided current by magnet power supply 20. The field intensity created by electromagnet 12 is variable according to the current that magnet power supply 20 is instructed to supply. The control of magnet power supply 20 is provided by controller 22 which, according to preselected programming, varies the magnetic field intensity during the analysis of unknown compound 10. Other means of effecting the magnetic field intensity on unknown object 10, such as mechanical modulation of the field or actually moving unknown object 10 within a spatially varying magnetic field, are possible.

In the preferred embodiment shown in FIG. 1, magnet power supply 20 is connected to controller 22 which causes the current through magnetic coil 18 to change as a function of time, thereby allowing variations in the magnetic field to which unknown object 10 is exposed. The magnetic field is varied so that during a portion of the test cycle, the material being inspected is exposed to a magnetic field of an intensity such that the nuclear magnetic resonance (NMR) frequency of one nuclear species contained in the unknown compound of interest, is made to equal the pure nuclear quadrupole resonance (NQR) frequency of a second (quadrupolar) nuclear species in the material.

The output of controller 22 is also connected to detector 24 which receives the amplified and processed signal from radiation detector 16 by way of amplifier and signal processor 26. This synchronizes the detection of the radiation with the magnetic field variations that are created, which enhances the detectability of any change which may occur in the radiation absorption or scattering. It is these changes in the absorption or scattering through unknown compound 10 which have been previously determined to be characteristic of specific compounds. If a match in radiation characteristics is found, detector 24 instructs display/indicator 28 to so inform the test operator. Identifying specific detected radiation characteristics with a specific magnetic field intensity is the primary function of the apparatus and method of the present invention.

Figure 2:
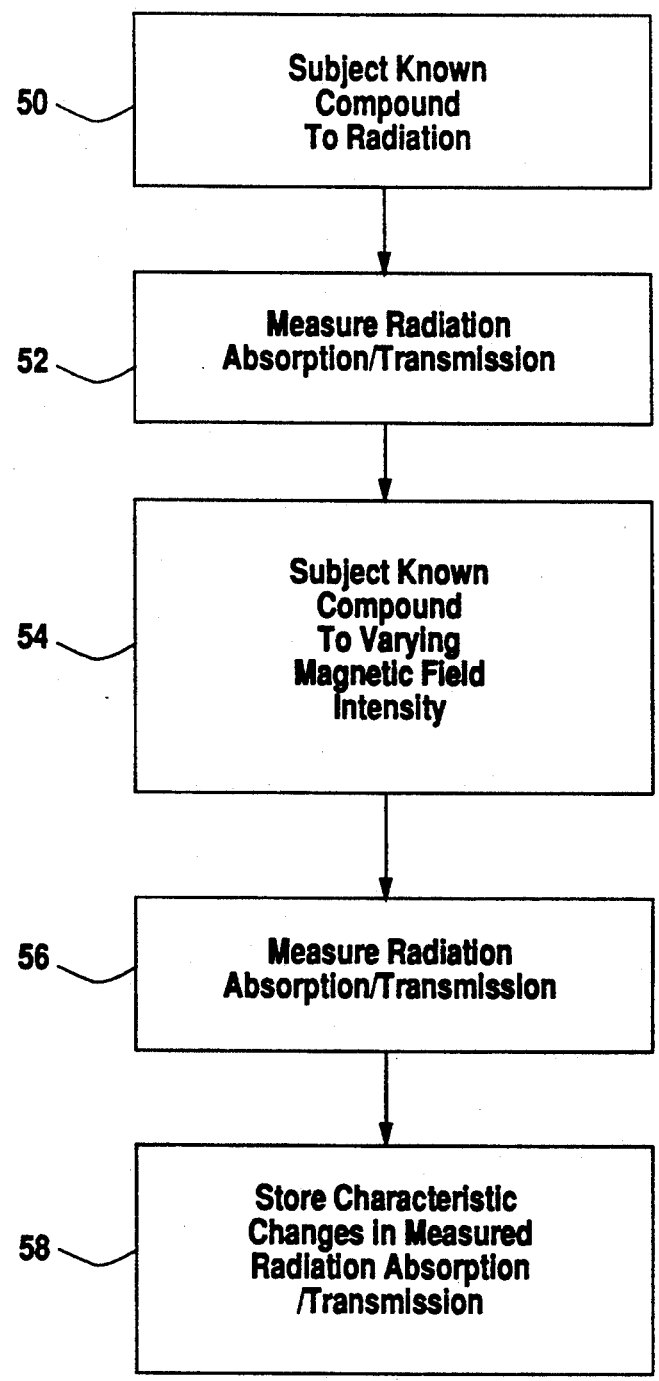
FIG. 2 is a block diagram flow chart of the steps associated with the method of "fingerprinting" a compound for later reference according to the present invention.

Reference is now made to FIG. 2 for a detailed description of the initial process of "fingerprinting" a known compound for later comparison and identification during examination of an unknown compound. The same apparatus disclosed in FIG. 1 for analyzing unknown compound 10 may also be used to create the necessary "fingerprint" information that may be stored to be later retrieved and compared with characteristics measured for unknown compounds.

The first step 50 of the process is to subject the known compound to radiation of a predetermined nature and level. Whether the radiation be gamma ray or thermal neutron radiation is dependant upon the particular compound to be "fingerprinted". The specific apparatus associated with each method of radiation treatment are described below in association with FIGS. 5 and 6. The second step 52 of the process involves the baseline measurement of the radiation absorption or transmission characteristics of the known compound in the absence of a magnetic field. This background baseline measurement is then stored for later comparison with measurements made in the presence of a magnetic field.

The third step 54 of the "fingerprinting" process involves subjecting the known compound to a varying magnetic field intensity. The magnetic field intensity is varied across a range known to include the intensity associated with maximum coupling between nuclei of the two species contained within the compound, one of which has a quadrupolar moment and the second of which exhibits simple NMR response. The magnetic field levels appropriate for such coupling are of a discrete level or range of levels.

The coupling created relates to the ease of interchange of energy between the first and second nuclear species. The energy exchange between the nuclei is enhanced when the magnetic field applied to the material containing the nuclei causes the frequency of the NMR of one nuclear species to agree with the frequency of the NQR of the second (quadrupolar) nuclear species. This effect decreases the spin-lattice relaxation time of one of the nuclear species which is an effect that is utilized in some of the other means of detecting the presence of certain compounds described previously. The present invention, however, relies upon the effect that the coupling has on the absorption and/or transmission of radiation through the object under study.

The fourth step 56, therefore, of the "fingerprinting" process involves measurement of the radiation absorption and/or transmission characteristics associated with a particular magnetic field intensity. Ideally, the compound is subjected to a varying magnetic field intensity in step 54 and a continuous measurement of the radiation absorption and transmission characteristics are made in step 56. This sweep of a varying magnetic field intensity and the associated radiation measurement provide a "fingerprint" of the particular compound under study.

Step 58 of the "fingerprinting" process involves storing for later reference the characteristic changes in the measured radiation absorption and/or transmission. These characteristics stored in step 58 may involve anything from the mere identification of a peak absorption or transmission value or may involve a more complex pattern of measured radiation absorption and transmission changes. Whatever the case, the "fingerprinting" process is designed to identify the particular pattern of changes associated with a specific magnetic field intensity and identifiable with the specific compound being tested.

Figure 3:
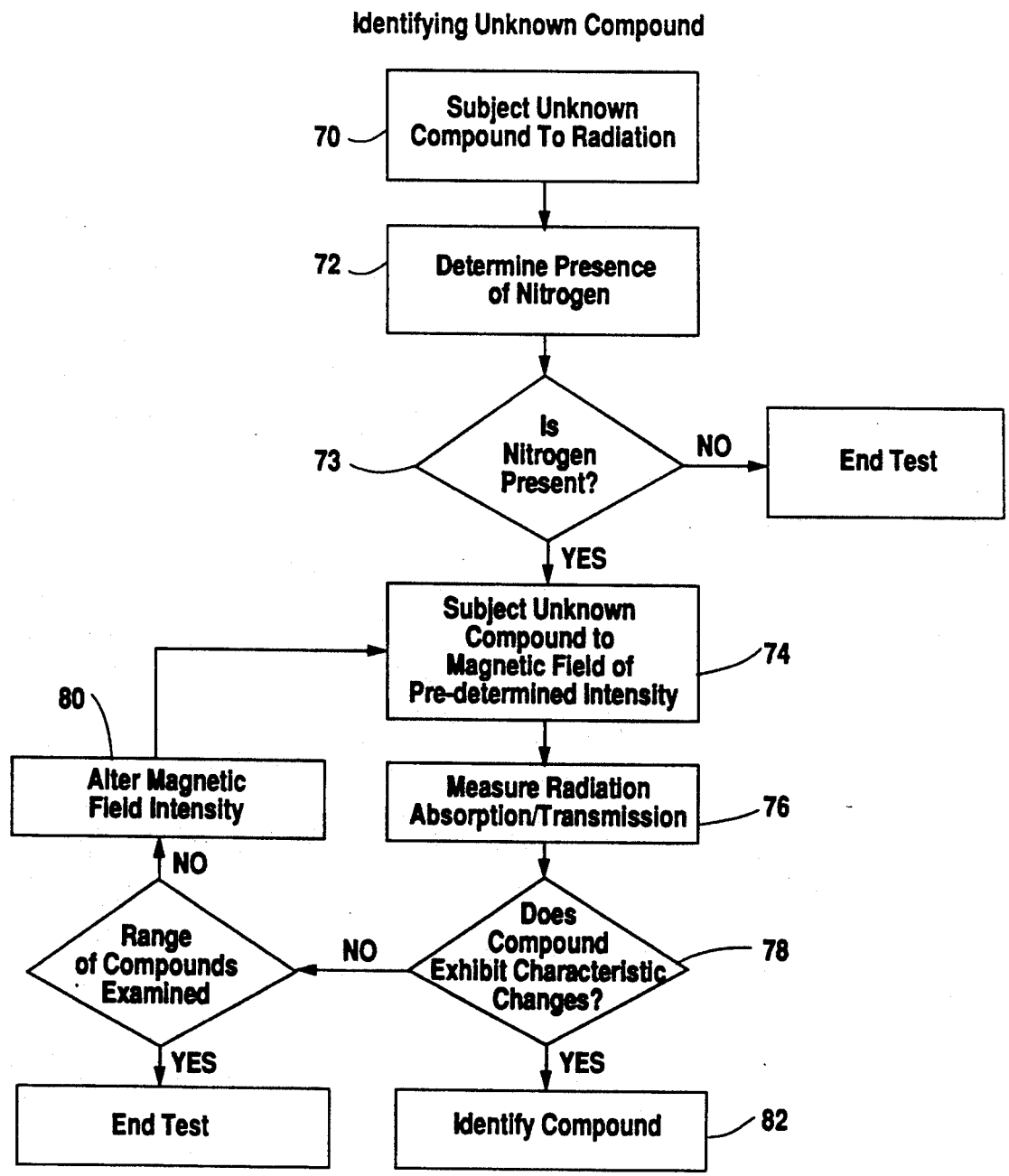
FIG. 3 is a block diagram flow chart of the steps associated with the method of identifying an unknown compound according to the present invention.

Reference is now made to FIG. 3 for a detailed description of the steps associated with identifying an unknown compound. As with the "fingerprinting" process, the process of identifying an unknown compound may be achieved with an apparatus of the type described in and disclosed by FIG. 1. The first step 70 in identifying an unknown compound involves subjecting the unknown compound to a specific type of radiation. In the preferred embodiment, this radiation may either be an initial beam of gamma rays towards the unknown object or may involve the projection of thermal neutrons into the object with a resulting measurable gamma ray emission.

An initial stage in the process of identifying an unknown compound involves step 72 of determining the gross presence of nitrogen within the compound. This initial stage is included primarily for the purpose of rapidly eliminating compounds which are not suspicious and are not likely to contain explosives or other materials desired to be identified. The question of "is nitrogen present" is answered in decision step 73.

If the compound is identified as containing nitrogen by step 73, the compound is then subjected in step 74 to a magnetic field of a predetermined intensity. This predetermined intensity is that specific field intensity, or set of field intensities, that were previously identified in the "fingerprinting" process disclosed in FIG. 2 as being associated with the specific compounds of interest.

A first predetermined magnetic field intensity is created in step 74 and the radiation absorption or transmission is measured in step 76. A decision is then made in step 78, based upon whether or not the compound exhibits radiation absorption and/or transmission characteristics typical of the compounds of interest.

In other words, if, in the "fingerprinting" process, a particular compound exhibits a specific radiation absorption and/or transmission change in response to a magnetic field intensity of a known value and the unknown compound exhibits a similar absorption and/or transmission change in response to the same magnetic field intensity, then a decision is made that the compound could be identified as the previously "fingerprinted" compound. The process then proceeds to step 82, wherein the compound is so described and an alarm or display of such identification is signaled.

If the compound does not exhibit the same radiation absorption and/or transmission characteristics, then the decision is made to alter the magnetic field intensity to a second or subsequent predetermined intensity to seek to identify other possible compounds of interest. This decision to alter the magnetic field intensity will be made as long as the system has not exhausted the range of compounds to be examined. Step 80 involves the process of altering the magnetic field to a second or subsequent predetermined field intensity. Step 74 and step 76 of measuring the radiation absorption/transmission changes are then repeated for this second or subsequent field intensity. Again, a decision is made whether or not the compound exhibits characteristic absorption and/or transmission changes and, therefore, whether or not the substance should be identified as in step 82 with a previously "fingerprinted" compound.

Steps 74 through 80 could conceivably be repeated indefinitely, but would be limited by the range of expected compounds that are preset in the system with a predetermined number of tests that are to be identified by the system. If a "no" response is received a predetermined number of times that would cover the expected range of compounds, the repetitive tests would end.

As described above, the present invention relates to a method and apparatus for detecting compounds that contain both nuclei of a first kind, which exhibit NMR behavior and nuclei of a second kind, which exhibit NQR behavior. Examples of such compounds include a range of narcotics and explosives such as cocaine, heroin, TNT, RDX, and PETN. With these specific compounds, a combination of hydrogen and nitrogen in varying ratios and concentrations can be identified and "fingerprinted" by the process described in association with FIG. 2, and thereafter unknown compounds for which it is desired to identify such compositions can be analyzed in accordance with the process and method described in association with FIG. 3.

Figure 4:
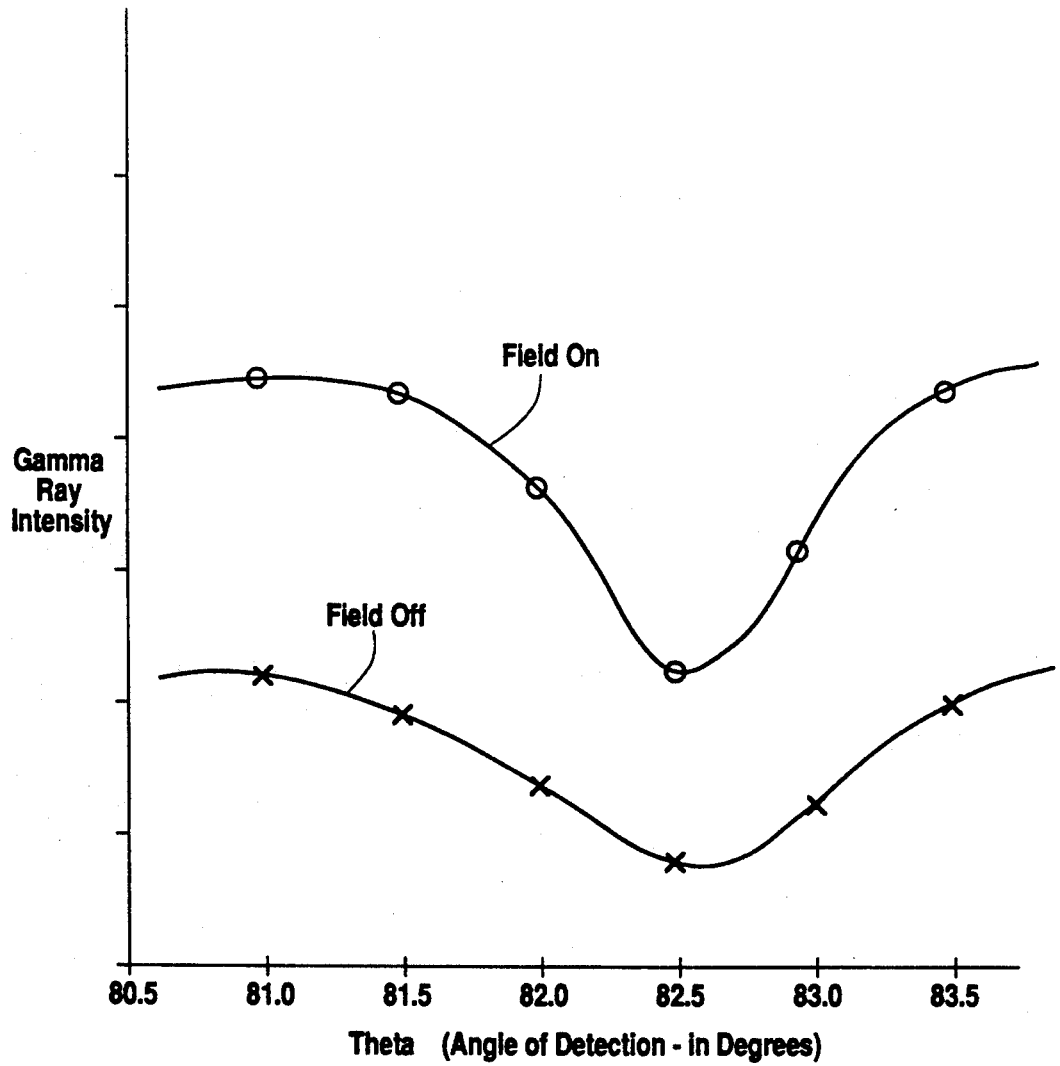
FIG. 4 is a graph of the resonant gamma ray absorption by nitrogen-14 with both a magnetic field switched on and with a magnetic field switched off.

Reference is now made to FIG. 4 for a graphic depiction of typical resonant gamma ray absorption by nitrogen-14 within an explosive compound, both with an external magnetic field on and with an external magnetic field off. The angle theta at which gamma rays are detected is shown along the X-coordinate of the graph in FIG. 4, while the relative magnitudes of the gamma rays detected are shown along the Y-coordinate of the graph. The specific magnetic field, at which maximum coupling is theoretically anticipated to occur in the specific substance examined, is represented by the magnetic "field on" state. Although the baselines for each of the curves of the graph in FIG. 4 are distinctive, it is the narrower and deeper absorption the "field on" data appears to have over the "field off" data, that is characteristic of the effect of the maximized coupling. This is a significant enough difference in the resonance absorption characteristics for the magnetic field intensity that is selected to maximize the NQR cross coupling effect, as to be measurable and identifiable with the specific compound. A multitude of such "fingerprint" graphs associated with different compounds can be created and stored in a computer memory and used to not only control the magnetic field intensity that an unknown object is subjected to, but to compare with the measured changes in the radiation absorption and/or transmission detected by analysis of the unknown compound. A match may thereby be made with a stored "fingerprint" and identification of the unknown compound as a previously "fingerprinted" compound can be accomplished.

Figure 5:
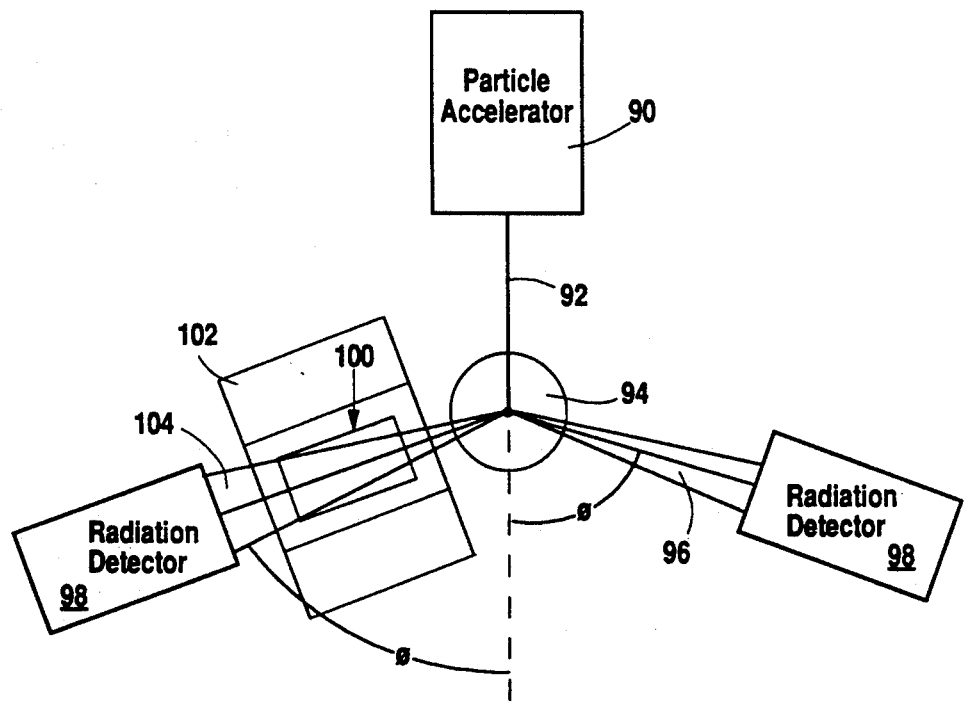
FIG. 5 is a schematic diagram of an apparatus for implementing a first method of irradiating the object to be examined that generates gamma rays from a carbon-13 target.

Reference is now made to FIG. 5 for a detailed description of an apparatus appropriate for providing radiation of a type suitable for the detection of nitrogen within an unknown compound and further being suitable for exhibiting changes when such nitrogen containing compounds are subjected to varying magnetic fields.

It has been determined that protons of sufficient energy, when collided with a carbon-13 target will generate high energy gamma rays of an energy necessary for resonant (maximum) absorption by nitrogen-14. In FIG. 5, particle accelerator 90 creates the necessary proton beam 92 of energy sufficient to create appropriate gamma rays 96. Proton beam 92 impinges upon carbon-13 target 94 and results in a scattering of gamma rays at an angle theta of approximately 80.7 degrees to the proton beam. The doppler shift associated with this generation of gamma rays is of exactly the correct value to produce a beam of gamma rays with an energy value required for resonant absorption by nitrogen-14.

Therefore, nitrogen containing compound 100 is positioned at an appropriate angle theta with respect to impinging proton beam 92. In the arrangement shown in FIG. 5, two duplicate gamma rays 96 are dispersed from carbon-13 target 94 and are measured by both radiation detectors 98. On one of these gamma ray beams 96 is placed nitrogen containing sample 100, which is surrounded by electromagnet 102. Gamma rays are appropriately absorbed by nitrogen containing sample 100 in part according to the magnetic field intensity that nitrogen containing sample 100 is subjected to. The resultant gamma ray radiation 104 is measured by radiation detector 98 and is matched with the particular magnetic field intensity created by electromagnet 102. The second radiation detector 98 serves to allow correction for external effects as described in more detail below.

Figure 6:
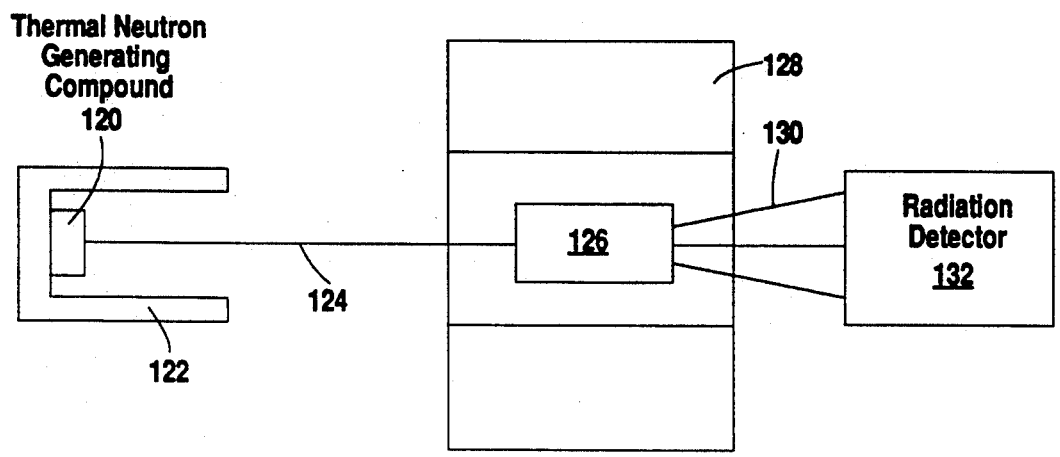
FIG. 6 is a schematic diagram of an apparatus for implementing a second method of irradiating the object to be examined that utilizes the principle of neutron capture.

Reference is now made to FIG. 6 for an alternative method of creating the necessary radiation to illuminate the characteristics associated with the NMR/NQR coupling achieved under a specific magnetic field intensity. With the thermal neutron technique for directing radiation at nitrogen containing sample shown in FIG. 6, all that is required is thermal neutron generating compound 120 enclosed within radiation shield/projector 122. Thermal neutron radiation is collimated and directed by radiation shield/projector 122 as thermal neutron beam 124. Beam 124 is directed at nitrogen containing compound 126, which is positioned appropriately between the poles of electromagnet 128. The neutron capture effect experienced by nitrogen nuclei results in the generation of gamma radiation 130. Gamma radiation 130 is measured by radiation detector 132. Not only does this process identify the presence of nitrogen within compound 126, but changes in the characteristics of gamma radiation 130 as measured by radiation detector 132 can be associated with variations in the magnetic field created by electromagnet 128, and can thereby be used to identify the compound. Naturally, the characteristics associated with variations in the gamma radiation in the thermal neutron method will be distinct from those associated with changes in the gamma radiation produced by the proton/carbon-13 target method described in association with FIG. 5. Therefore, the "fingerprinting" process utilized would be specific to the type of radiation that is utilized in analysis of the unknown substance. In other words, the reference characteristics for the radiation absorption and/or transmission should be established by an apparatus similar to that used in the "fingerprinting" process.

TECHNICAL BACKGROUND

The technique underlying measurements made by the apparatus and method of a preferred embodiment of the present invention rely upon the resonant absorption of gamma ray photons by nitrogen-14. Any nitrogenous material placed in a beam of gamma rays of an appropriate energy will absorb the photons of gamma rays with a relatively high cross section. Nitrogen present in some explosives exhibits nuclear quadrupole resonance at various frequencies in the 1 to 5 megahertz range. Application of a magnetic field of the appropriated intensity (generally in the 200 to 1500 gauss range) causes the nuclei of hydrogen atoms, which are also typically present in explosive materials, to have an NMR frequency coincident with the nitrogen NQR frequency. Previous NMR work, described in the prior art above, utilized the greatly enhanced energy transfer between the hydrogen and nitrogen nuclei and the effect that this has on the proton NMR characteristics (for example the NMR spin-lattice relaxation time) to detect the occurrence of the cross coupling. The present invention detects this cross coupling by its effect upon transmitted or absorbed radiation.

In studies made implementing the apparatus and method of the present invention, test materials were located in a magnetic field and irradiated with gamma rays created by the apparatus described in FIG. 5. The intensity of the gamma ray transmission was monitored as the scattering angle between the incident proton beam and the emitted gamma ray beam was varied. Since the doppler shift varied with scattering angle, by sweeping the detector through various angles, the incident gamma ray energy is effectively varied.

As shown in FIG. 5, to compensate for the effects of beam current fluctuation and the presence of the magnetic field, a second gamma ray detector is used on the side of the proton beam line opposite the sample system. When the magnet was switched on in the test apparatus, the fringe field created by the magnet altered the detector response, effectively reducing the detector gain by about 30%. The radiation characteristics detected through the sample side detector were, therefore, normalized by dividing by the radiation detected in the reference detector.

In experimentation with the preferred embodiment, a proton beam calibrated to ensure the requisite 9.17 MeV protons were incident on the carbon-14 target. The absorption dip (shown in FIG. 4), absent the magnetic field, agreed with calculations based upon published data. In the presence of the magnetic field, a scan was begun at a scattering angle of 80 degrees and the angle was incremented in 0.2 degree steps, except around the center of the resonance where 0.1 degree steps were used. At each position, data was collected with no magnetic field applied and then repeated, without moving the sample, with an applied field of 800 gauss at the center of the magnet. The homogeneity of the field was such that the field over the sample was everywhere within the range 780 to 800 gauss.

The proton (hydrogen) NMR/nitrogen NQR crossover region in the sample tested occurred at fields from 750 gauss to 820 gauss, so all parts of the sample were, therefore, subjected to magnetic fields that would satisfy the crossover condition. A typical result was exhibited by the test sample similar to that shown in FIG. 4. As mentioned above, the baseline distinction between the magnet "on" and the magnet "off" data shown in FIG. 4 is not believed to be significant, but rather the shape of the absorption dip is the characteristic of importance. It is believed that the differences seen in the two baselines are due to the shift in detector calibration in the fringe field of the magnet. Two calibrations (with and without magnetic fields) require two sets of energy windows to be set to observe the 9.17 MeV protons. Small differences between the true width of these two windows could easily account for the small baseline shift (1% of reference detector count rates) observed here.

The data from these experiments, therefore, shows that there are significant differences in the resonant absorption characteristics in a magnetic field intensity selected to maximize the NQR cross coupling effect compared to those effects in no applied magnetic field.

ALTERNATIVE EMBODIMENTS ASSOCIATED WITH OTHER ELEMENTS WHICH EXHIBIT NQR BEHAVIOR

As mentioned previously, nitrogen is but one element that exhibits nuclear quadrupole resonant behavior. The method and apparatus outlined in association with the present invention could be utilized with any substance that has within it elements that exhibit NQR behavior and elements that exhibit basic NMR behavior. The hydrogen/nitrogen compounds utilized in the studies associated with the preferred embodiment of the present invention have analogous nuclear pairs in a multitude of other such NMR/NQR combinations. The NQR and NMR characteristics of most elements have been established and are well known in the field. Any such combinations can, therefore, be experimentally studied and "fingerprinted" according to the method of the present invention, and thereafter have their "fingerprints" stored for later reference and comparison in an analysis of unknown substances.

While in certain situations, speed and accuracy can be achieved by limiting the range of substances that are anticipated or desired to be discovered, in theory, a broad scope of referenced "fingerprints" and magnetic field intensities could be utilized in the analysis of an unknown compound. The speed with which the unknown compound is analyzed is limited only by the controlled variation of the magnetic field and the computer processed analysis of the resultant radiation changes with pre-established characteristic curves. It is more likely that the mechanical movement of the sample through the magnetic field and the repositioning of the radiation detector for various anticipated elements and compounds will be the limiting factors on the speed and accuracy of such devices.

While a single apparatus might be appropriate for the analysis of a number of different expected compounds, for the speed and accuracy needed in a particular application, a more limited arrangement which reduces the parameters and thereby narrows the number of various compounds expected, might be more appropriate. In any event, the underlying method for "fingerprinting" the various compounds and thereafter analyzing unknown compounds for comparison with these "fingerprints" is the same.

It is anticipated that, in addition to the gamma radiation and the thermal neutron radiation techniques that are described herein, any number of other methods of irradiating the sample are possible as long as characteristic interactions with nuclear resonance features can be documented. It is anticipated that one skilled in the art will identify such additional materials that are subject to this analysis, as well as such additional means for irradiating these materials that are appropriate for utilization with this analysis.

What is claimed is:

1. A method of detecting the presence of a compound containing both nuclei of a first kind which exhibit NMR (nuclear magnetic resonance) behavior and nuclei of a second kind which exhibit NQR (nuclear quadrupole resonance) comprising the steps of:
    subjecting a first material known to contain said compound to radiation;
    subjecting said first material known to contain said compound to a magnetic field;
    measuring a reference change in the absorption and/or transmission of said radiation through said first material in the presence and in the absence of said magnetic field;
    subjecting a second material suspected of containing said compound to radiation;
    subjecting said second material suspected of containing said compound to a magnetic field;
    measuring a test change in the absorption and/or transmission of said radiation through said second material in the presence and in the absence of said magnetic field;
    comparing said test change with said reference change; and
    using the results of the said comparing step to determine the presence or absence of said compound in said second material.

2. A method for determining the presence of specific elements and/or compounds within an object comprising the steps of:
    subjecting said object to electromagnetic or particulate radiation;

measuring first characteristics of electromagnetic or particulate radiation absorbed and/or transmitted by said object;

subjecting said object to a magnetic field of a specific intensity predetermined to create a change in said radiation absorbed and/or transmitted by said object if said specific elements and/or compounds are present;

measuring second characteristics of electromagnetic or particulate radiation absorbed and/or transmitted by said object;

comparing the second measured characteristics of radiation absorbed and/or transmitted with the first measured characteristics of said radiation absorbed and/or transmitted, and identifying a change between said measured characteristics;

comparing said change between said measured characteristics with predetermined radiation changes characteristic of said specific elements and/or compounds; and using the results of the said comparing step to identify elements and/or compounds;

wherein said magnetic field of a specific intensity has been predetermined to effect a cross coupling between nuclei of a first element exhibiting nuclear magnetic resonant behavior and nuclei of a second element exhibiting nuclear quadrupole resonant behavior.

3. A method claimed in claim 2 in which the step of subjecting said object to radiation comprises exposing said object to a thermal neutron beam generated from a thermal neutron source, wherein an emission of gamma radiation from said object as a result of neutron capture by atomic nuclei of said compound will occur.

4. The method of claim 2, wherein said step of subjecting said object to radiation comprises the steps of:
accelerating protons in a particle accelerator;
directing said accelerated protons at a carbon-13 target, whereby gamma radiation of an appropriate energy level is emitted;
directing said gamma radiation at said object.

5. The method of claim 2 further comprising the step of determining the presence of nitrogen in said object prior to said step of subjecting said object to a magnetic field of specific intensity.

6. An apparatus for determining the presence of specific elements and/or compounds within an object comprising:
a radiation source, said radiation source directing radiation at said object;
a radiation detector, said radiation detector detecting radiation from said object;
an electromagnet capable of generating a varying magnetic field about said object;
means for detecting a change in said radiation detected from said object, both in the presence of said magnetic field and in the absence of said magnetic field;
means for storing reference characteristic changes in said radiation previously identified with said specific elements and/or compounds; and
means for correlating said change in said radiation with said reference characteristic identifying said specific elements and/or compounds as being present within said object.

7. The apparatus of claim 6, wherein said radiation source comprises a thermal neutron source, wherein said thermal neutron source directs a thermal neutron beam at said object and an emission of gamma radiation from said object as a result of neutron capture by atomic nuclei of said compound will occur.

8. The apparatus of claim 6, wherein said radiation source comprises:
a particle accelerator capable of accelerating protons with energy levels sufficient to excite a carbon-13 target to emit gamma radiation; and
a carbon-13 target;
wherein said particle accelerator accelerates protons and directs them at said carbon-13 target, said carbon-13 target thereby emitting gamma radiation of an appropriate energy level and directing said gamma radiation at said object.

9. The apparatus of claim 6 further comprising means for determining the presence of nitrogen in said object, wherein the failure to detect the presence of nitrogen in said object confirms the absence of said specific elements and/or compounds within said object.

* * * * *